United States Patent [19]

Maetani et al.

[11] Patent Number: 4,675,093
[45] Date of Patent: Jun. 23, 1987

[54] SELECTIVELY PLATING APPARATUS FOR FORMING AN ANNULAR COATED AREA

[75] Inventors: Kazuo Maetani; Keisuke Wada, both of Oume, Japan

[73] Assignee: Sumitomo Metal Mining Company Limited, Tokyo, Japan

[21] Appl. No.: 823,630

[22] Filed: Jan. 29, 1986

[30] Foreign Application Priority Data

Jan. 31, 1985 [JP] Japan .................................. 60-17394
Jan. 31, 1985 [JP] Japan .................................. 60-17395
Jan. 31, 1985 [JP] Japan .................................. 60-12537

[51] Int. Cl.[4] .............................................. C25D 17/00
[52] U.S. Cl. .................................. 204/224 R; 204/275
[58] Field of Search .................... 204/224 R, 15, , 275

[56] References Cited

U.S. PATENT DOCUMENTS

| 3,763,027 | 10/1973 | Pearson | 204/224 R |
| 4,119,516 | 10/1978 | Yamaguchi | 204/224 R |
| 4,163,704 | 8/1979 | Murata | 204/224 R X |
| 4,240,880 | 12/1980 | Tsuchibuchi et al. | 204/224 R X |
| 4,339,319 | 7/1982 | Algo | 204/224 R |
| 4,340,449 | 7/1982 | Srinivasan et al. | 204/224 R X |

Primary Examiner—Donald R. Valentine
Attorney, Agent, or Firm—Watson, Cole, Grindle & Watson

[57] ABSTRACT

The invention involves a selectively plating apparatus for forming an annular area.

The apparatus is particularly characterized by including the inner and outer mask members which cooperate to define the annular areas to be coated. It enables the automatic operation for forming the annular coated areas and is very effective for the mass production of, for example, lead frames.

5 Claims, 12 Drawing Figures

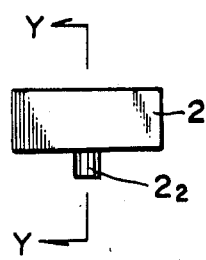
FIG. 6A
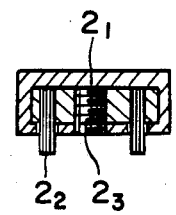
FIG. 6B
FIG. 7A
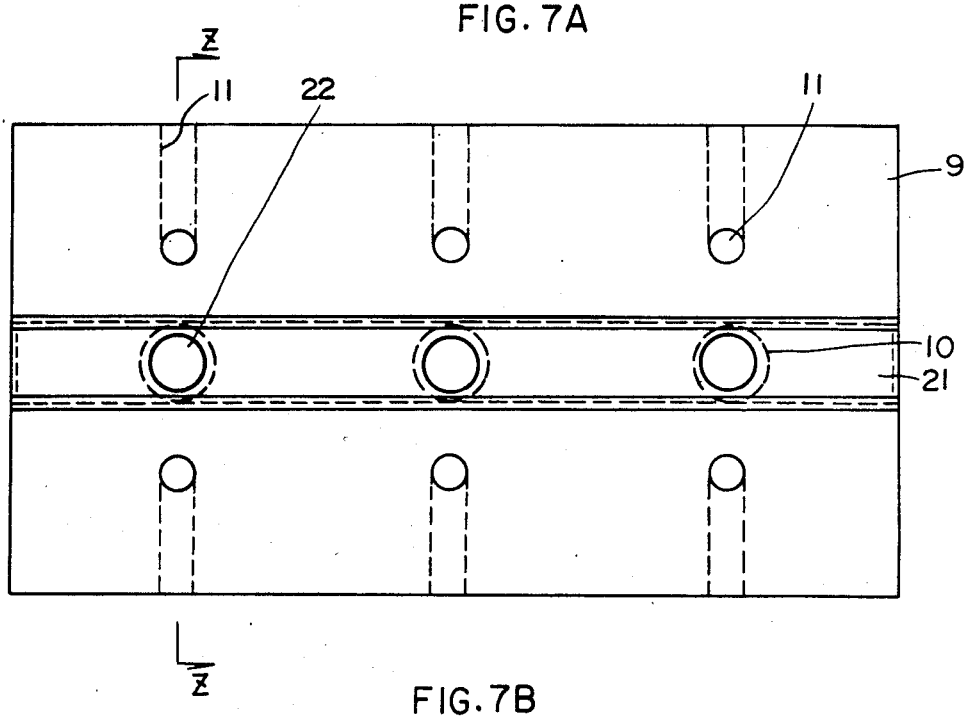
FIG. 7B
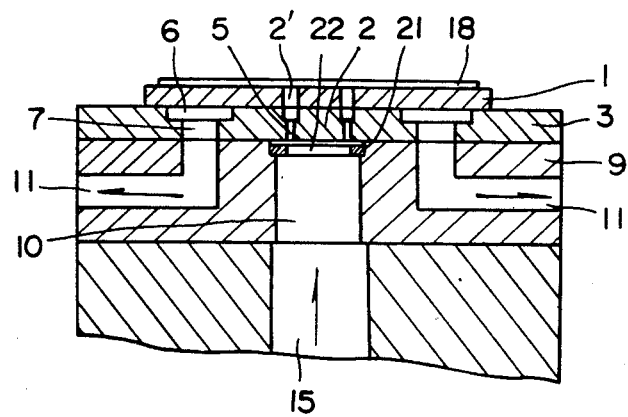

SELECTIVELY PLATING APPARATUS FOR FORMING AN ANNULAR COATED AREA

BACKGROUND OF THE INVENTION

1. Field of the Invention

This invention relates to a selectively plating apparatus for forming an annular coated area.

2. Description of the Prior Art

FIG. 1 shows a lead frame. It is only the free ends b of inner leads a and islands c that are plated with gold, silver, etc. A known apparatus for the partial plating of those portions includes a mask member 21 having an opening 21a so sized as to enclose each group of the ends b of inner leads a and the corresponding island c and a mask support 22 having a hole 22a aligned with the opening 21a of the mask 21. The apparatus is shown in FIG. 2. When a lead frame 23 is plated, it is placed on the mask 21 so that the ends b of the inner leads a and the island c may be aligned with the opening 21a. A plating solution is received under pressure from a pump and jetted out through a pressure vessel 27 and a nozzle 24 against the lead frame 23 which is held against the mask member 21 by a pressing plate 26. A sheet of rubber 25 is disposed between the lead frame 23 and the pressing plate 26. The pressure vessel 27 is used for supplying the plating solution uniformly to the area to be plated. An anode is connected to the plating solution, and a cathode to the lead frame, though they are not shown.

If the lead frame is of the type in which an IC element is bonded by an adhesive, however, no plating is required for the island c, but it is sufficient to form an annular coated area around the island c, i.e., only the ends b of the inner leads a which are required for wire bonding. Such a lead frame can be plated by the apparatus of FIG. 2 if the island c on which an IC element is mounted is masked. This, however, presents a great deal of difficulty especially when a large number of lead frames must be plated on a mass production basis. Moreover, it is highly desirable to plate only the ends of the inner leads in order to save gold and silver.

SUMMARY OF THE INVENTION

Under these circumstances, it is an object of this invention to provide an annularly plating apparatus which is suitable for automatic operation and thereby enables mass production.

This object is attained by an apparatus which comprises a pressure vessel for supplying a plating solution under pressure uniformly from a pump to the material to be coated, a member for supporting the pressure vessel, the member having an opening, a baffle provided in the opening of the supporting member for maintaining the uniform supply of the plating solution up the opening, an upper member mounted on the pressure vessel supporting member and having a hole for supplying the plating solution and a plurality of holes for discharging the plating solution, the upper member being adapted to position an insoluble anode in a location suitable for plating the material to be coated, a mask supporting member mounted on the upper member and having a substantially annular array of slits for jetting out the plating solution, a groove for causing the plating solution to flow substantially radially outwardly from the slits and a plurality of holes for discharging the plating solution, an outer mask member provided on the mask supporting member and defining the outer contour of the substantially annular area to be coated, and a plurality of inner mask members provided on the mask supporting member and each defining the inner contour of the substantially annular area to be coated.

The material to be plated, e.g a lead frame, is positioned on the inner and outer mask members and a pressing plate having a bottom lined with rubber is placed on the lead frame to hold it against the mask members. The pump is driven to supply the plating solution through the pressure vessel and its supporting member and an electric current is supplied across the anode and a cathode, which is defined by the lead frame. This invention does not require any additional masking of the islands on which the IC elements are mounted, but enables the mass production of lead frames having annularly coated areas. The plating solution which has impinged against the lead frame is returned through the groove and the holes into its reservoir.

The apparatus of this invention is particularly characterized by including the inner and outer mask members which cooperate to define the annular areas to be coated. It enables the automatic operation for forming the annular coated areas and is very effective for the mass production of, for example, lead frames.

BRIEF DESCRIPTION OF THE DRAWINGS

FIG. 6(A) is a front elevational view of an inner mask member;

FIG. 6(B) is a sectional view taken along the line Y—Y of FIG. 6(A);

FIG. 7(A) is a fragmentary top plan view of another apparatus embodying this invention;

FIG. 7(B) is a sectional view taken along the line Z—Z of FIG. 7(A);

DETAILED DESCRIPTION OF THE INVENTION

Figure 1:
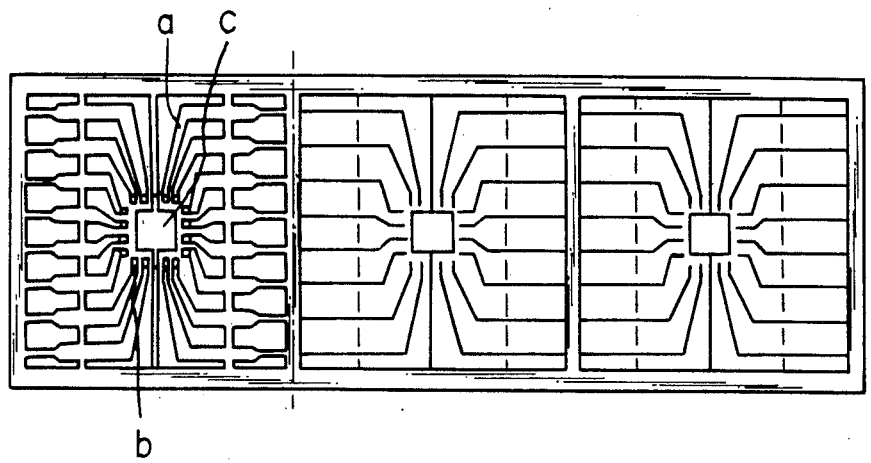
FIG. 1 is a view showing the construction of a lead frame.
Figure 2:
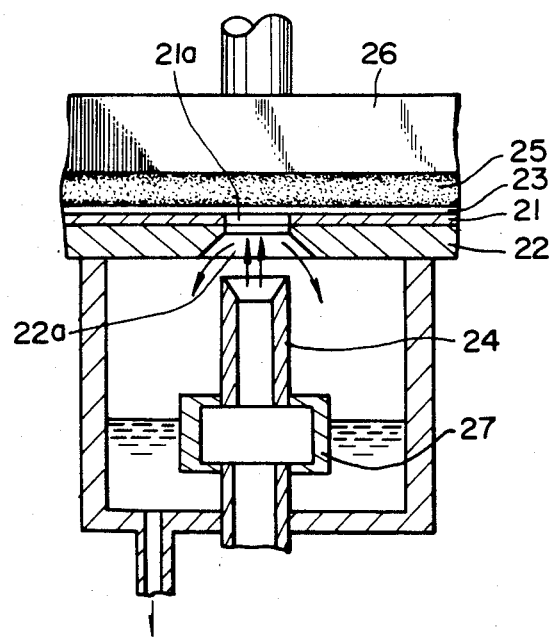
FIG. 2 is a vertical sectional view of a known plating apparatus which is used for the partial coating of a lead frame.
Figure 3:
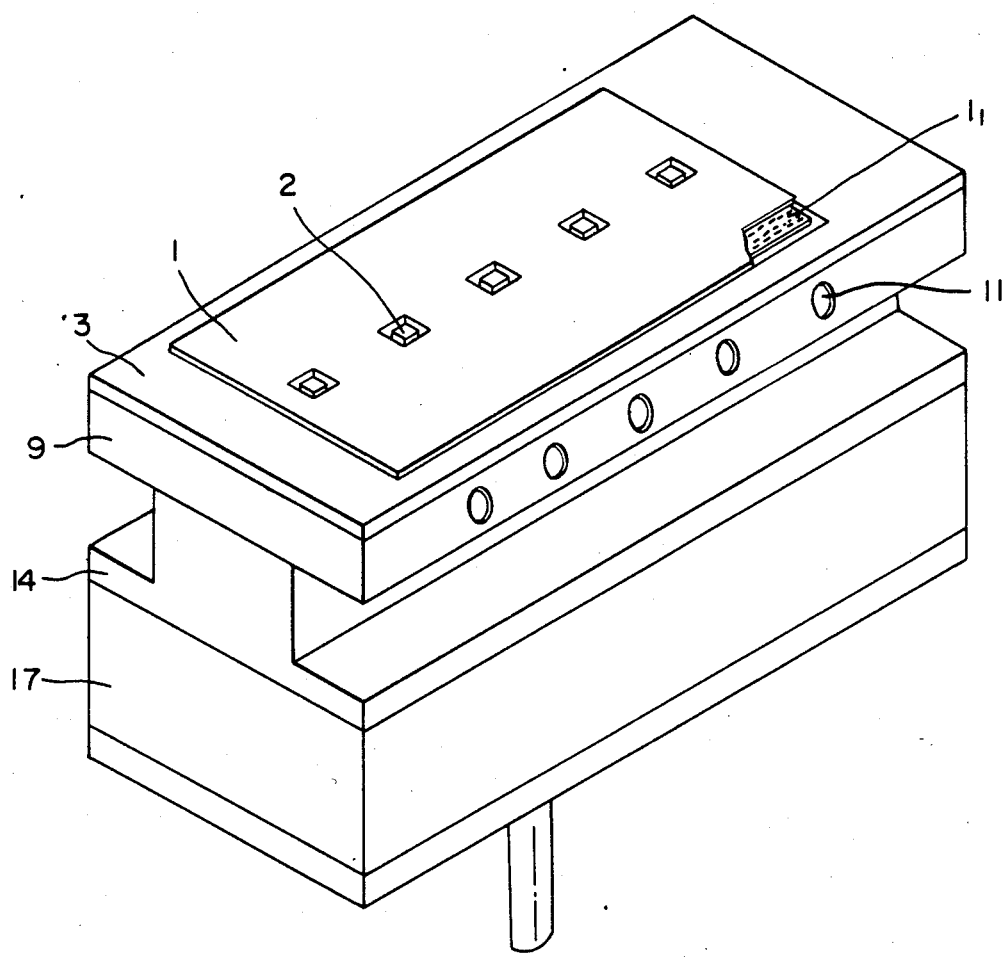
FIG. 3 is a perspective view of an apparatus embodying this invention.
Figure 4:
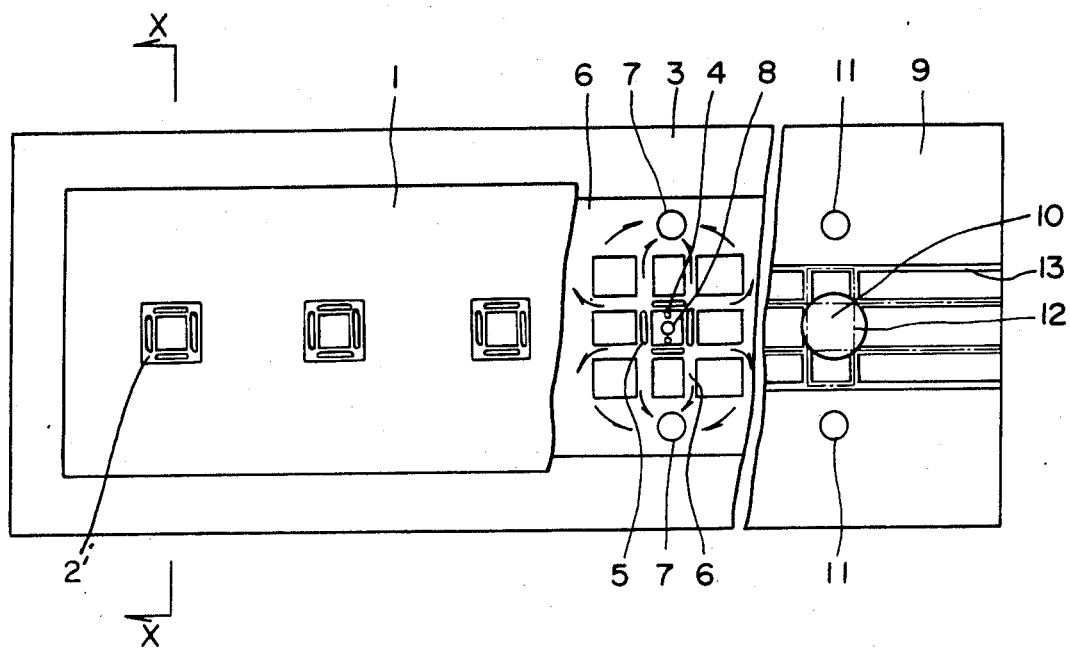
FIG. 4 is a top plan view, partly in section, of the apparatus embodying this invention.
Figure 5:
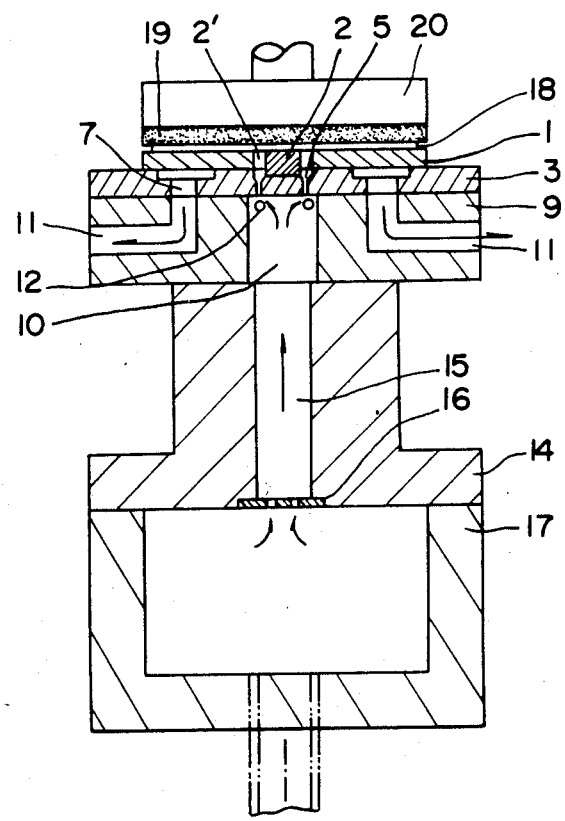
FIG. 5 is a sectional view taken along the line X—X of FIG. 4.

An annular partial plating apparatus embodying this invention is shown in FIGS. 3 to 5. It includes an outer mask member 1 formed from silicone rubber and containing a reinforcing core $1_1$. It also includes a plurality of inner mask members 2 each formed from silicone rubber, containing a reinforcing core $2_1$, and having a plurality of positioning pins $2_2$, as shown in FIGS. 6(A) and 6(B). The reinforcing core $2_1$ has a threaded hole $2_3$ in which a screw is received for securing the inner mask member 2 to a mask supporting member 3. The pins $2_2$ are aligned with positioning holes 4 (FIG. 4). The outer mask member 1 and each inner mask member 2 define therebetween a substantially annular opening 2' in which the ends b of the inner leads of a lead frame (FIG. 1) can be located. The mask members 1 and 2 are supported on the mask supporting member 3. The mask supporting member 3 has a plurality of slits 5 disposed in a substantially annular array along each opening 2' for supplying a plating solution thereinto, a groove 6 for causing the plating solution to flow substantially radially outwardly from each slit 5 and a plurality of holes 7 for discharging the plating solution from the groove 6. The positioning holes 4 are provided in the mask supporting member 3 for positioning each inner mask member 2. The mask supporting member 3 also has a plurality of holes 8 each receiving the screw for securing one of the inner mask members 2. An upper member 9 is disposed under the mask supporting member 3. The upper member 9 has a plurality of holes 10 for supplying the plating solution into the slits 5 and a plurality of holes 11 for discharging the plating solution from the discharge holes 7 of the mask supporting member 3.

The upper member 9 also has a groove 13 in the form of a grid. An insoluble anode 12 in the form of a wire, e.g. of platinum, is provided in the groove 13 under each slit 5 so that it may face the area of the lead frame to be plated. The anode wire 12 extends along all of the slits 5 to ensure the formation of an annularly coated area having a uniform coating thickness. The upper member 9 is supported on a supporting member 14 having an opening 15 for supplying the plating solution to the slits 5 and provided with a baffle 16 for maintaining the uniform supply of the solution through the opening 15. A pressure vessel 17 is disposed under the supporting member 14 for supplying the plating solution at a uniform pressure from a pump to the material to be coated.

The lead frame 18 to be plated is positioned on the outer and inner mask members 1 and 2 and a pressing plate 20 having a bottom lined with a sheet of rubber 19 is placed on the lead frame 18 to press it against the mask members 1 and 2, as shown in FIG. 5. The plating solution is supplied by the pump into the hole 10 of the upper member 9 and an electric current is applied across the anode wire 12 and the lead frame 18 which defines a cathode. The solution which has impinged against the lead frame 18 is returned through the groove 6 and the holes 7 and 11 into its reservoir not shown. It is not necessary to provide any special mask for the islands each time the plating operation is performed, since the islands on which the IC elements are mounted are automatically masked by the inner mask members 2.

In the apparatus as hereinabove described, the platinum wire 12 defining an insoluble anode is disposed in the groove 13 of the upper member 9 below the slits 5. The lead frames 18 are, however, available in a wide variety of designs which differ to some extent from one another in the number of the lead frames to be produced from one sheet, the dimensions of the islands and the dimensions of the area to be plated. Therefore, it has been necessary to prepare a combination of the mask members 1 and 2, the mask supporting member 3 and the upper member 9 for each lead frame design. If the mask members 1 and 2 are bonded to the supporting member 3 to form an integral mask combination, it is necessary to prepare any such mask combination for each lead frame design. It is, however, not always necessary to provide any upper member 9 for each such mask combination. Therefore, if the upper member 9 is of the type which can be used for all the mask combinations, it is advantageously possible to reduce the number of the parts which must be kept in stock, and thereby the cost thereof. An embodiment of this invention which is based on this concept is shown in FIGS. 7(A) and 7(B).

The apparatus shown in FIGS. 7(A) and 7(B) includes an upper member 9 having a hole 10 for supplying a plating solution below the slits 5, and provided with a shoulder at the upper end of the hole 10. An insoluble anode plate 21 is supported on the shoulder and has a plurality of apertures 22 each located below one of the openings 2' between the mask members 1 and 2. The anode plate 21 is easy to position or remove. It is sufficient to change the anode plate 21 to one which suits the lead frame 18 to be plated. There is no necessity of changing the upper member 9 as a whole.

The anode plate 21 is preferably formed from platinum or a platinum alloy, as platinum or a platinum alloy is easy to work. The holes 22 of the anode plate 21 need be sufficiently large to enable the appropriate supply of the plating solution to the slits 5. If they are too large, however, they present difficulty in the application of an electric current. Therefore, it is appropriate to select the shape and size of the holes 22 which suit the outer periphery of the slits 5.

Each inner mask member 2 is in the form of a square of which each side has a length of only about 5 to 10 mm. The inner mask members 2 are elastic. Therefore, the bonding of each inner mask member 2 in its right position is a very difficult job and requires a jig which is not easy to prepare. If there is any inner mask member 2 that has not been correctly positioned, the opening or clearance between the inner mask member 2 and the outer mask member 1 lacks uniformity in width. As a result, it is likely that the end of one or more inner leads may be partly masked, or that the plating solution may fail to be supplied uniformly and not be able to form a coated film having a uniform thickness.

Figure 8A:
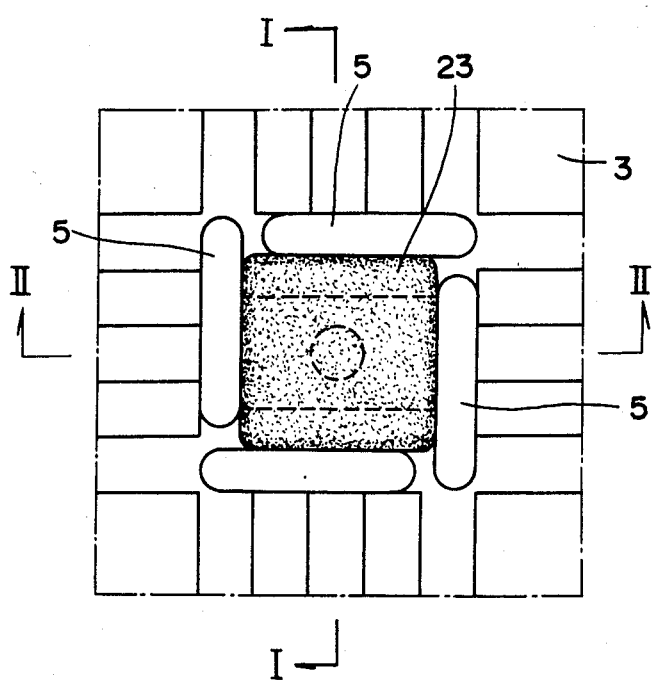
FIG. 8(A) is an enlarged top plan view of a modified inner mask member.
Figure 8B:
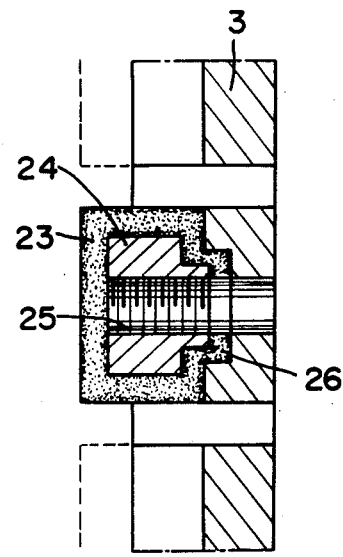
FIG. 8(B) is a sectional view taken along the line I—I of FIG. 8(A)
Figure 8C:
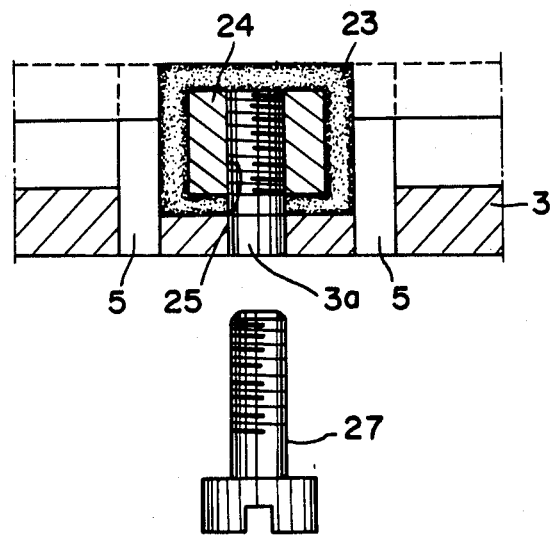
FIG. 8(C) is a sectional view taken along the line II—II of FIG. 8(A).

A modified inner mask member is, therefore, shown in FIGS. 8(A) to 8(C). The inner mask member 23 comprises an elastic body, such as of silicone rubber, covering a core 24. The core 24 has a threaded hole 25 in which a screw 27 can be threadedly engaged for securing the inner mask member 23 to a mask supporting member 3, as shown in FIG. 8(C). The inner mask member 23 is easy to produce if the core 24 in which the screw 27 is engaged is placed in a mold, and if silicone rubber, for example, is poured into the mold and solidified. The inner mask member 23 has a rectangular projection 26 at its bottom, as shown in FIG. 8(B), while the mask supporting member 3 has a recess in which the projection 26 can be fitted. The projection 26 and the recess facilitate the correct positioning of the inner mask member 23 as shown in FIG. 8(A). The projection 26 may be of any other shape if it prevents the rotation of the mask member 23. The mask supporting member 3 has a hole 3a through which the screw 27 extends into the threaded hole 25 of the core 24 to hold the core 24 against the mask supporting member 3 to secure the inner mask member 23 in position.

What is claimed is:
1. An apparatus for plating a substantially annular area selectively, comprising:
   a pressure vessel for supplying a plating solution under pressure uniformly from a pump to the material to be plated;
   a supporting member, said member having an opening for receiving said solution from said vessel;

a baffle provided in said opening for maintaining the uniform distribution of said solution into said opening;

an upper member mounted on said supporting member and having a plurality of holes for receiving said solution from said opening and a plurality of holes for discharging said solution, said upper member being adapted to position an insoluble anode in a location suitable for plating the material to be plated;

a mask supporting member mounted on said upper member and having a plurality of substantially annular arrays of slits for receiving said solution from said solution receiving holes of said upper member and jetting it out against the material to be plated, a groove for causing said solution to flow substantially radially outwardly from each of said slits and a plurality of holes for discharging said solution;

an outer mask member disposed on said mask supporting member and having a plurality of apertures each defining an unmasked area; and a plurality of inner mask members each disposed within one of said apertures to define a substantially annular clearance between said outer mask member and said each inner mask member.

2. An apparatus for plating a substantially annular area selectively, comprising:

a pressure vessel for supplying a plating solution under pressure uniformly from a pump to the material to be plated;

a supporting member, said member having an opening for receiving said solution from said vessel;

a baffle provided in said opening for maintaining the uniform distribution of said solution into said opening;

an upper member mounted on said supporting member and having a plurality of holes for receiving said solution from said opening and a plurality of holes for discharging said solution, said upper member being adapted to position an insoluble anode in a location suitable for plating the material to be plated;

a mask supporting member mounted on said upper member and having a plurality of substantially annular arrays of slits for receiving said solution from said solution receiving holes of said upper member and jetting it out against the material to be plated, a groove for causing said solution to flow substantially radially outwardly from each of said slits and a plurality of holes for discharging said solution;

said upper member having a groove located below each of said arrays of slits, said anode comprising an insoluble anode wire in the form of a grid disposed in each said groove;

an outer mask member disposed on said mask supporting member and having a plurality of apertures each defining an unmasked area; and a plurality of inner mask members each disposed within on the said aperatures to define a substantially annular clearance between said outer mask member and said each inner mask member.

3. An apparatus for plating a substantially annular area selectively, comprising:

a pressure vessel for supplying a plating solution under pressure uniformly from a pump to the material to be plated;

a supporting member, said member having an opening for receiving said solution from said vessel;

a baffle provided in said opening for maintaining the uniform distribution of said solution into said opening;

an upper member mounted on said supporting member and having a plurality of holes for receiving said solution from said opening and a plurality of holes for discharging said solution, said upper member being adapted to position an insoluble anode in a location suitable for plating the material to be plated;

a mask supporting member mounted on said upper member and having a plurality of substantially annular arrays of slits for receiving said solution from said solution receiving holes of said upper member and jetting it out against the material to be plated, a groove for causing said solution to flow substantially radially outwardly from each of said slits and a plurality of holes for discharging said solution;

an outer mask member disposed on said mask supporting member and having a plurality of apertures each defining an unmasked area;

a plurality of inner mask members each disposed within on the said aperatures to define a substantially annular clearance between said outer mask member and said each inner mask member; and said upper member having a shoulder formed at the upper end of each of said solution receiving holes below one of said slit arrays, said anode comprising an insoluble anode plate which is supported on said shoulder and which has a plurality of apertures each aligned with one of said clearances.

4. An apparatus for plating a substantially annular area selectively, comprising:

a pressure vessel for supplying a plating solution under pressure uniformly from a pump to the material to be plated;

a supporting member, said member having an opening for receiving said solution from said vessel;

a baffle provided in said opening for maintaining the uniform distribution of said solution into said opening;

an upper member mounted on said supporting member and having a plurality of holes for receiving said solution from said opening and a plurality of holes for discharging said solution, said upper member being adapted to position an insoluble anode in a location suitable for plating the material to be plated;

a mask supporting member mounted on said upper member and having a plurality of substantially annular arrays of slits for receiving said solution from said solution receiving holes of said upper member and jetting it out against the material to be plated, a groove for causing said solution to flow substantially radially outwardly from each of said slits and a plurality of holes for discharging said solution;

an outer mask member disposed on said mask supporting member and having a plurality of apertures each defining an unmasked area;

a plurality of inner mask members each disposed within on the said aperatures to define a substantially annular clearance between said outer mask member and said each inner mask member; and each of said inner mask members being formed from silicone rubber, containing a reinforcing core, and having a plurality of positioning pins, said mask supporting member having a plurality of positioning holes respectively receiving said pins, said core having a threaded hole and said mask supporting member having a hole through which a screw extends and threadedly engages said threaded hole for securing each said inner mask member to said outer mask member.

5. An apparatus for plating a substantially annular area selectively, comprising:

as pressure vessel for supplying a plating solution under pressure uniformly from a pump to the material to be plated;

a supporting member, said member having an opening for receiving said solution from said vessel;

a baffle provided in said opening for maintaining the uniform distribution of said solution into said opening;

an upper member mounted on said supporting member and having a plurality of holes for receiving said solution from said opening and a plurality of holes for discharging said solution, said upper member being adapted to position an insoluble anode in a location suitable for plating the material to be plated;

a mask supporting member mounted on said upper member and having a plurality of substantially annular arrays of slits for receiving said solution from said solution receiving holes of said upper member and jetting it out against the material to be plated, a groove for causing said solution to flow substantially radially outwardly from each of said slits and a plurality of holes for discharging said solution;

an outer mask member disposed on said mask supporting member and having a plurality of apertures each defining an unmasked area;

a plurality of inner mask members each disposed within on the said aperatures to define a substantially annular clearance between said outer mask member and said each inner mask member; and each of said inner mask members having a rectangular projection at the bottom thereof, said mask supporting member having a plurality of recesses respectively receiving each said projection, each said inner mask member having an embedded core extending into each of said recesses and being secured to said mask supporting member by a screw extending through said mask supporting member into said core.

* * * * *